United States Patent
Grodzki (10) Patent No.: US 9,804,240 B2
(45) Date of Patent: Oct. 31, 2017

(54) METHOD AND DEVICE FOR CONTROLLING A MAGNETIC RESONANCE IMAGING APPARATUS

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 471 days.

(21) Appl. No.: 14/509,407

(22) Filed: Oct. 8, 2014

(65) Prior Publication Data

US 2015/0097566 A1   Apr. 9, 2015

(30) Foreign Application Priority Data

Oct. 8, 2013   (DE) .................. 10 2013 220 301

(51) Int. Cl.
| | |
|---|---|
| *G01R 33/38* | (2006.01) |
| *G01R 33/54* | (2006.01) |
| *G01R 33/28* | (2006.01) |
| *G01R 33/34* | (2006.01) |
| *G01R 33/385* | (2006.01) |
| *G01R 33/483* | (2006.01) |

(52) U.S. Cl.
CPC ......... *G01R 33/543* (2013.01); *G01R 33/288* (2013.01); *G01R 33/34076* (2013.01); *G01R 33/385* (2013.01); *G01R 33/3854* (2013.01); *G01R 33/4833* (2013.01)

(58) Field of Classification Search
CPC   G01R 33/543; G01R 33/288; G01R 33/5617; G01R 33/4835; G01R 33/34833; G01R 33/5615; A61B 5/055
See application file for complete search history.

(56) References Cited

U.S. PATENT DOCUMENTS

| | | | |
|---|---|---|---|
| 4,893,081 A | 1/1990 | Zur | |
| 5,450,010 A | 9/1995 | Van Der Meulen et al. | |
| 8,228,060 B2* | 7/2012 | Busse | A61B 5/055 324/307 |
| 2008/0319301 A1* | 12/2008 | Busse | A61B 5/055 600/410 |
| 2010/0308829 A1* | 12/2010 | Vu | G01R 33/288 324/314 |
| 2012/0194185 A1* | 8/2012 | Ritter | G01R 33/4836 324/309 |
| 2013/0033262 A1* | 2/2013 | Porter | A61B 5/055 324/309 |
| 2013/0249548 A1* | 9/2013 | Stemmer | G01R 33/543 324/309 |
| 2014/0028313 A1* | 1/2014 | Paul | G01R 33/5617 324/309 |
| 2014/0091795 A1* | 4/2014 | Grodzki | G01R 33/543 324/309 |
| 2014/0111200 A1* | 4/2014 | Grodzki | G01R 33/4833 324/309 |
| 2014/0210471 A1* | 7/2014 | Stemmer | G01R 33/56554 324/309 |

(Continued)

FOREIGN PATENT DOCUMENTS

DE   102012219016 B3   3/2014

*Primary Examiner* — Clayton E Laballe
*Assistant Examiner* — Ruifeng Pu
(74) *Attorney, Agent, or Firm* — Schiff Hardin LLP (57) ABSTRACT

Starting with a magnetic resonance imaging system control sequence that has a radio-frequency (RF) pulse train to control the RF transmission system and a gradient pulse train, chronologically matching the RF pulse train, to control the gradient system, the gradient pulse train including a predetermined selection gradient pulse chronologically matched to a refocusing pulse of the RF pulse train, the execution capability of the control sequence is initially established using an execution capability criterion, in particular under consideration of a refocusing flip angle of the refocusing pulse. Modification of the refocusing pulse and/or of the selection gradient pulse takes place depending on the establishment of the execution capability of the control sequence.

12 Claims, 4 Drawing Sheets

(56) References Cited

U.S. PATENT DOCUMENTS

| | | | |
|---|---|---|---|
| 2014/0320127 A1* | 10/2014 | Paul | G01R 33/543 324/309 |
| 2015/0042333 A1* | 2/2015 | Grodzki | G01R 33/543 324/309 |
| 2015/0168524 A1* | 6/2015 | Nittka | G01R 33/56536 324/309 |
| 2015/0204953 A1* | 7/2015 | Ookawa | G01R 33/543 324/309 |
| 2015/0204957 A1* | 7/2015 | Smith | G01R 33/446 324/309 |
| 2015/0268322 A1* | 9/2015 | Paul | G01R 33/34 324/309 |
| 2015/0285878 A1* | 10/2015 | Gonen | G01R 33/485 324/309 |
| 2015/0285885 A1* | 10/2015 | Feiweier | G01R 33/288 324/309 |
| 2015/0293197 A1* | 10/2015 | Taniguchi | G01R 33/543 324/309 |
| 2015/0309139 A1* | 10/2015 | Bachschmidt | G01R 33/341 324/309 |
| 2016/0131731 A1* | 5/2016 | Oka | A61B 5/055 324/309 |
| 2016/0139222 A1* | 5/2016 | Frydman | G01R 33/483 324/309 |

* cited by examiner

METHOD AND DEVICE FOR
CONTROLLING A MAGNETIC RESONANCE
IMAGING APPARATUS

BACKGROUND OF THE INVENTION

Field of the Invention

The present invention concerns a method to determine a control sequence for operating a magnetic resonance imaging apparatus to generate image data of the inside of an examination subject, as well as a control sequence determination device, and a magnetic resonance imaging apparatus with such a control sequence determination device, to implement such a method.

Description of the Prior Art

In a magnetic resonance system (also called a magnetic resonance tomography system or magnetic resonance imaging system), the body to be examined is typically exposed in a scanner to a relatively high basic magnetic field, for example of 1, 5, 3 or 7 Tesla, with the use of a basic field magnet system. A magnetic field gradient is additionally applied with the aid of a gradient system. Radio-frequency excitation signals (RF signals) are then emitted by suitable antenna devices via a radio-frequency transmission system, which cause nuclear spins of specific atoms to be excited to resonance by being deflected, by an amount known as a defined "flip angle", relative to the magnetic field lines of the basic magnetic field. Upon relaxation of the nuclear spins, radio-frequency signals (magnetic resonance signals) are radiated that are received by suitable reception antennas and then are processed further. The desired image data are reconstructed from the raw data acquired in such a manner.

For a defined measurement, a defined pulse sequence is emitted from a control unit (control computer) of the apparatus, which is composed of a series of radio-frequency (RF) pulses (in particular excitation pulses and refocusing pulses) as well as gradient pulses to be emitted in coordination with the RF pulses in different spatial directions, as well as readout windows set to match these during which the induced magnetic resonance signals are received. The gradient pulses are defined by their gradient amplitude, the gradient pulse duration and their edge steepness dG/dt, typically designated as a "slew rate". Another important gradient pulse variable is the gradient pulse moment, which is defined by the integral of the amplitude over time.

The timing within the sequence (i.e. in which time intervals which pulses follow one another) is thereby significant for imaging. A number of control parameters is normally defined as a measurement protocol, which has been created in advance and can be retrieved (from a memory, for example) for a specific measurement. The retrieved protocol can, if necessary, be modified on site by the operator, who can provide additional control parameters such as, for example, a defined slice interval of a stack of slices to be measured, a slice thickness, etc. A pulse sequence (is also designated as a control sequence) is then calculated on the basis of all of these control parameters.

During a pulse sequence, switching takes place frequently between the magnetic gradient coils via which the gradient pulses are emitted. Eddy currents that are thereby generated—in particular in other components of the magnetic resonance scanner, are one reason for the known development of noise during the switching of the gradients. In particular, a high edge steepness of the gradient pulses contributes to the noise exposure. In addition to this, steep edges lead to a higher energy consumption and additionally place higher demands on the gradient system. The rapidly changing gradient fields lead to distortions and fluctuations in the gradient coils, and to the transfer of these energies to the scanner housing.

Various solutions in the design of hardware in order to reduce the noise exposure have been proposed, for example by potting or vacuum sealing the gradient coils. Another possibility is to pay attention to the gradient curve in advance, in the calculation of the pulse sequences. In practice, there are therefore apparatuses that offer differing manners of operation known as "gradient modes". For example, the operator can hereby select between a normal mode and a particularly quiet gradient mode as needed. In the quiet gradient mode, a maximum allowable edge steepness for the gradient pulses is set to a lower value, which leads to the situation that the measurement is quieter than in the normal mode. However, normally this setting disadvantageously not only leads to a longer measurement time overall, but also has the effect that the image quality (for example the contrast and/or the resolution) is reduced. Given such a limitation of the global maximum slew rate, a compromise must always be found between the reduction of the noise volume, the measurement time and the image quality. For example, a longer echo spacing—thus a greater interval between the echoes—has a negative effect on the contrast and the image sharpness in a control sequence in which a series of echo signals is induced, for example in spin echo sequences (SE sequences) or in turbo spin echo sequences (TSE sequences).

In a number of pulse sequences that are often used in clinical magnetic resonance tomography (MRT), for example, the cited echo sequences, pulses known as gradient spoiler pulses (spoilers, for short) are activated in addition to the gradient pulses that are necessary for a spatial coding. Gradient spoiler pulses (which, in some cases, particularly if they occur in pairs, are also called gradient crusher pulses, crushers for short) are produced by the same gradient coils immediately before and/or after the spatial coding gradient pulses, and ensure that (for example) unwanted free induction decay (FID) signals are suppressed. The spoilers or crushers must have a defined spoiler or crusher moment so that they suppress the FID signals with certainty.

A large part of the noise in MRT examinations results from the spoiler pulses, in particular in the use of SE or TSE sequences.

In order to alleviate the problems noted above, a given quiet pulse sequence is disclosed, in German Patent Application DE 10 2012 219 010, wherein an optimization method is executed that optimizes the edge steepness of the crushers in combination with the pulse level and duration of the gradient pulses bounded by the respective crusher.

Figure 1:
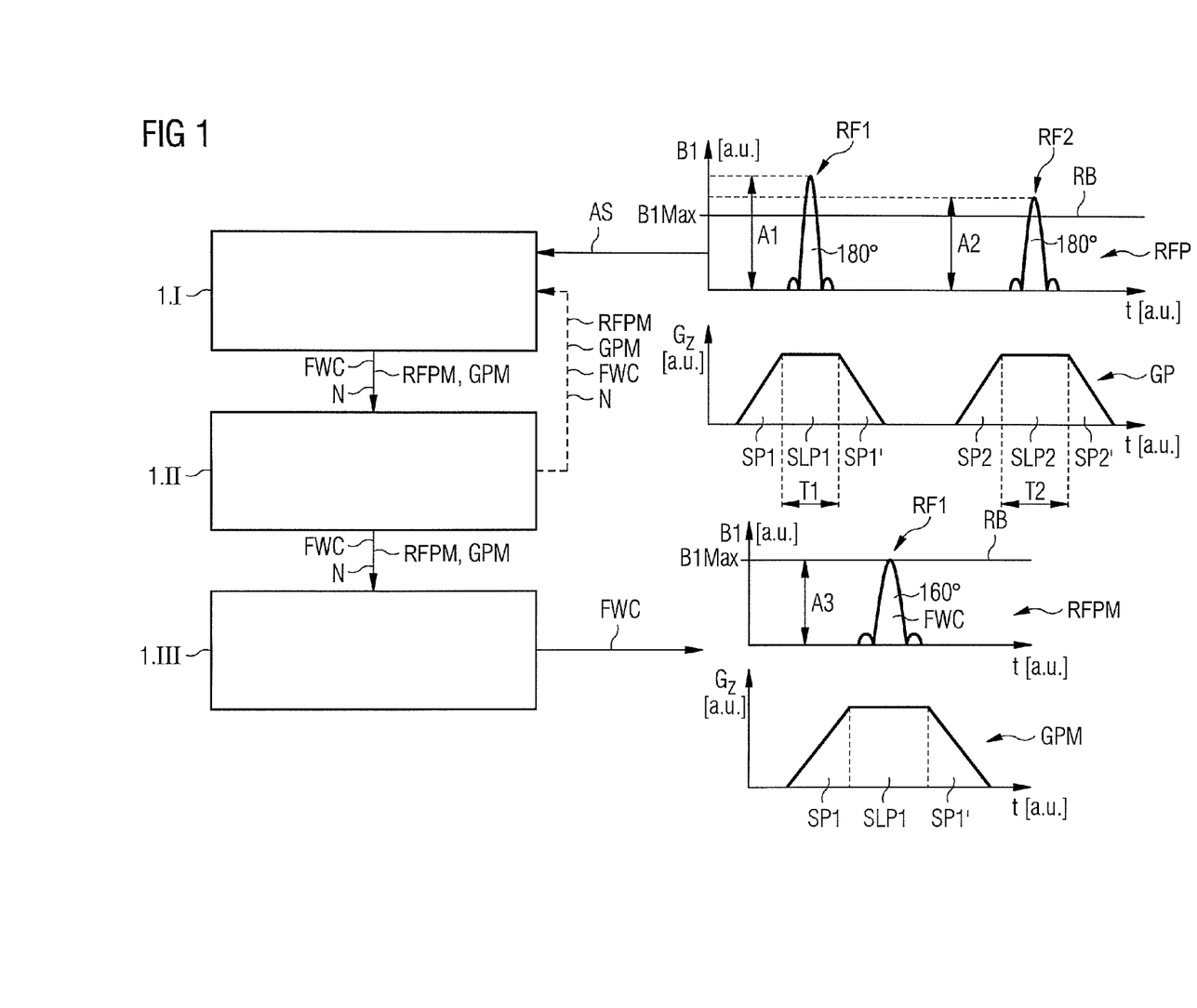
FIG. 1 shows a first exemplary embodiment of the method according to the invention.

For example, one result of this optimization can then be a pulse train as shown in FIG. 1, which can be used as input data in the method according to the invention as described later herein.

The input data diagrammed in FIG. 1 include a control sequence AS with a schematically shown portion of a sequence diagram of a radio-frequency pulse train RFP that includes refocusing pulses RF1, RF2, and a gradient pulse train GP that includes slice selection gradient pulses SLP1, SLP2. The slice selection gradient pulse thereby serves as a spatial selection pulse for selection of a spatial region, i.e. in particular for selection of the slice in the examination subject that the refocusing should affect. The slice selection gradient pulse is executed simultaneously with the refocusing pulse so that this acts only on the selected slice or, respectively, the selected spatial region.

As an example, in the following only the slice selection gradient pulse SLP1 is considered. The slice selection pulse SLP1 is bounded by spoiler pulses SP1, SP2 that together form a crusher pulse and have an edge steepness that is optimal with regard to noise development. The refocusing pulse RF1 that is emitted to chronologically match the slice selection gradient pulse SLP1 is emitted with a high amplitude A1 (maximum value of the amplitude). This high amplitude has the effect that high demands are placed on the hardware of the magnetic resonance system that is used, and also causes the SAR exposure value of an examination subject scanned with this pulse sequence to increase discontinuously. Both are not always acceptable, in particularly in clinical operation.

SUMMARY OF THE INVENTION

An object of the invention is to alleviate these problems, thus to adapt a control sequence to the hardware of a magnetic resonance imaging system or to an examination subject to be scanned with the use of such a control sequence.

According to the invention, a method is provided for determining a control sequence for a magnetic resonance imaging system, wherein, in the control sequence, a radio-frequency pulse train is provided for controlling an RF transmission system of the magnetic resonance imaging system, and a gradient pulse train is provided that is to be executed chronologically matching said radio-frequency pulse train, to control a gradient system of the magnetic resonance imaging system.

The gradient pulse train includes a predetermined spatial slice selection gradient pulse that in particular is noise-optimized with regard to the noise development, for example as described above, together with adjoining spoilers.

As mentioned, the spatial slice selection gradient pulse can serve for selection of a slice of the examination subject, i.e. be a pure "slice selection gradient pulse". However, it is also conceivable that not only a thin slice, but rather a larger volume (for example a slab or the like), is spatially excited with the use of the slice selection gradient pulse, by a radio-frequency pulse (for example a refocusing pulse) emitted in parallel therewith.

The radio-frequency pulse train includes a refocusing pulse that chronologically matches the spatial slice selection gradient pulse. "Chronologically matches" as used herein means that the refocusing pulse is emitted simultaneously with the slice selection gradient pulse and across the entire duration of the slice selection gradient pulse. The adjoining spoilers or crushers are in particular not taken into account to determine this duration since, as mentioned, the spatial slice selection gradient pulse is executed simultaneously with the refocusing pulse so that this acts only on the selected spatial region. However, without limitation of generality, a slice selection gradient pulse is used in the following as an example.

In the method according to the invention, the execution capability of the examination subject is initially checked or established in an initial step using an execution capability criterion. The execution capability criterion establishes whether the control sequence is usable in a specified magnetic resonance imaging system, or type of magnetic resonance imaging system, and/or a specified examination subject, meaning that the execution capability criterion can be established on the basis of parameters or parameter values of the hardware of the magnetic resonance imaging system and/or of the examination subject.

The establishment or checking of the execution capability of the control sequence preferably takes place under consideration of a maximum value of a flip angle that can be influenced with a refocusing pulse. The value that the flip angle may have at maximum with regard to a value range between 90° and 180° so that it is refocused with certainty with the respective refocusing pulse is also designated as a refocusing flip angle. Other occurring flip angles can be refocused with certainty via refocusing pulses that are designed for a flip angle mirrored in the quadrants between 90° and 180°. The bandwidth that can be influenced by means of a refocusing pulse is thereby equivalent, which bandwidth can be determined from a combination of the duration of the refocusing pulse and the amplitude value of the refocusing pulse (precisely from the integral of the amplitude value over the duration of the refocusing pulse). This means that, given a constant "pulse shape", the bandwidth depends only on the duration of the pulse. Instead of the flip angle, the bandwidth—or also a combination of amplitude value and duration of the refocusing pulse—can thus be taken into account in the establishment of the execution capability. The result of this establishment can simply include only the information of whether the control sequence is executable or not, in particular without modification. Moreover, the result can also include information about the deviation of flip angles (which flip angles can be modified with a refocusing pulse that is present in the control sequence) relative to the flip angle taken into account in the establishment of the execution capability, thus for example the information about the deviation of real flip angles from desired flip angles (i.e. refocusing flip angles) that should be achieved in the control sequence.

The method according to the invention also includes the step of modifying the refocusing pulse and/or the selection gradient pulse depending on the result of the establishment of the execution capability of the control sequence. If it is established that the control sequence is executable according to the execution capability criterion, no modified advantageously takes place.

In this method, multiple aspects are taken into account that enable an adaptation of the control sequence to the conditions of a medical imaging system and/or an examination subject that is to be imaged with the aid of said imaging system. In a turbo spin echo control sequence, the theoretically optimal refocusing flip angle amounts to 180°. However, for most applications it is possible with nearly unchanged image quality to reduce the refocusing flip angle to 160°, and to use this as a target flip angle. For some applications, a refocusing flip angle or, respectively, target flip angle of 120° is also possible. The invention takes these aspects into account in order to enable the adaptation of the control sequence without significant compromises with regard to the noise generation, such that the noted execution capability criterion is upheld.

The invention thus also concerns a control sequence determination system with an input interface to accept a control sequence with a radio-frequency pulse train to control an RF transmission system of the magnetic resonance imaging system, and a gradient pulse train (that is to be executed to chronologically match said radio-frequency pulse train) to control a gradient system of the magnetic resonance imaging system. Furthermore, the gradient pulse train includes a predetermined selection gradient pulse for which the radio-frequency pulse train includes a chronologically matching refocusing pulse.

As mentioned, the accepted control sequence is preferably a control sequence optimized according to a method described in German Patent Application DE 10 2012 219 010.

The control sequence determination system also has a criterion source to provide an execution capability criterion, as well as an evaluation unit which is designed to establish the execution capability of such a control sequence (with a radio-frequency pulse train and the gradient pulse train) using or under consideration of the execution capability criterion. The control sequence determination system has a modification unit designed to modify the refocusing pulse and/or the selection gradient pulse depending on the result of the establishment of the execution capability of the control sequence.

The invention also encompasses a magnetic resonance imaging system having such a control sequence determination system.

The execution capability criterion can be based on a hardware parameter of a magnetic resonance imaging system. Only a type information of a magnetic resonance imaging system can thereby also be taken into account to establish the execution capability criterion. For example, the hardware parameter can be the maximum power of a radio-frequency amplifier that is comprised in the mentioned RF system to execute the refocusing pulse included in the control sequence. For example, it is often the case in 3T magnetic resonance imaging systems a maximum transmission power of the RFPA (radio-frequency power amplifier) of the scanner is rapidly encountered due to the increase of the pulse bandwidths according to the aforementioned noise optimization method. This maximum transmission power can be considered in the execution capability criterion and is, for example, included in the execution capability criterion as a power limit value. For example, all refocusing pulses of the control sequence with regard to the required transmission power—which is then compared with the power limit value—can then be examined to establish the execution capability of the control sequence.

The maximum allowable SAR exposure of the examination subject also may not be exceeded by increasing the pulse bandwidths. The execution capability criterion can therefore be based on a SAR exposure value of an examination subject to be imaged with a magnetic resonance imaging system. For example, a simulation of the expected SAR exposure of a subsequent examination subject to be imaged can be implemented using the control sequence to establish the execution capability. The SAR exposure value determined in the course of the simulation can then be compared with a SAR that is provided as an execution capability criterion or, respectively, is included in the execution capability criterion.

In an embodiment development, the amplitude value or the amplitude of the chronologically matching refocusing pulse is modified to vary the refocusing pulse. in particular, the method can thereby proceed so that the duration of the refocusing pulse remains constant and continues to chronologically match an associated, unmodified slice selection gradient pulse of the control sequence. This allows the noise optimization of the slice selection gradient pulses that has already been implemented to remain unchanged.

Alternatively, the duration of the refocusing pulse can be modified, particularly in addition to the amplitude or the amplitude value. This can be used in an embodiment of the invention in which a modification of the slice selection gradient pulse chronologically matching the refocusing pulse also takes place. The duration of the slice selection gradient pulse is modified while maintaining the gradient moment of the slice selection gradient pulse. This ensures that the slice selected with the use of the slice selection gradient pulse or the selected volume of the examination subject that is to be excited or refocused remains unchanged, in spite of the variation of the duration of the slice selection gradient pulse. The duration of the refocusing pulse is matched to the modified duration of the slice selection gradient pulse.

The method is preferably executed iteratively, and thus repeated multiple times under consideration of the result of a preceding iteration of the method. The repetition can be implemented until a termination condition or termination criterion is satisfied. In particular, the establishment that the control sequence as being actually executable under consideration of the execution capability criterion—in particular after a modification has been implemented—can be used as such a termination condition or termination criterion. Alternatively, whether a predetermined maximum number of repetitions (iterations) has been reached can be monitored as the termination criterion.

The iterative repetition is particularly suitable if a modification of the refocusing pulse and/or of the slice selection gradient pulse takes place in steps. This means that the variation of the refocusing pulse and/or of the slice selection gradient pulse is implemented according to a predetermined step width that predetermines how large or the variation is in each iteration step. In particular, the step width can be predetermined with regard to a modification of the maximum value of the amplitude of the refocusing pulse. Given a constant duration of the refocusing pulse, for example, this also corresponds to a predetermined step width for the bandwidth of the refocusing pulse or a step width of the refocusing flip angle that can be affected with the refocusing pulse. For example, the step width of the variation of the duration of the slice selection gradient pulse can also be predetermined. The variation of the duration of the slice selection gradient pulse can mean that a deviation takes place from a slice selection gradient pulse that is optimal with regard to the noise development due to the gradient system. In particular, with the use of a predetermined step width for the modification of the duration, it can be established the effect that the adaptation of the duration of the slice selection gradient pulse has relative to the adaptation of the amplitude of the refocusing pulse.

In another embodiment of the invention, the refocusing flip angle that is taken into account to establish the execution capability is a flip angle that is determined using the duration of the slice selection gradient pulse, relative to which duration the refocusing pulse is arranged so as to chronologically match. The considered refocusing flip angle is determined from the control sequence and represents a "candidate flip angle" for which the execution capability is checked under consideration of the execution capability criterion. It is thus a refocusing flip angle that should be used as a target flip angle given a successful check, which refocusing flip angle is checked as a type of "candidate". In an iterative method, the control sequence modified in the prior iteration forms the basis for a new repeat run of the method, such that in this case the considered candidate flip angle can be determined from the modified control sequence. As mentioned, it is equivalent to use a "candidate bandwidth" to establish the execution capability, instead of a flip angle. Instead of the candidate flip angle, the candidate bandwidth of the refocusing pulse can be used that is determined using the duration of the chronologically matching slice selection gradient pulse. Alternatively, it is also conceivable to check a "candidate" amplitude—i.e. the maximum value of the amplitude—of the respective refocusing pulses.

In another embodiment of the invention, a minimal refocusing flip angle known as a "least refocusing flip angle"—is predetermined or entered using a user interface; and this minimum refocusing flip angle can be influenced at least by the refocusing pulse.

This predetermined minimum refocusing flip angle can then be considered in the execution capability criterion in addition to the candidate flip angle. The predetermined minimum refocusing flip angle—i.e. the minimum refocusing flip angle—can in this case be compared with the respective candidate flip angle of the individual refocusing pulses, for example to establish the execution capability of the control sequence. For example, a control sequence can be classified as executable if the condition that all refocusing flip angles of the control sequence are greater than or equal to the minimum refocusing flip angle is also satisfied, in addition to other aforementioned execution capability criteria (for example pertaining to the SAR exposure or the amplifier power). A lower limit for the modification of the refocusing pulses can be provided so that a desired image quality can be ensured. It is thus possible to avoid signal loss and contrast change that could be caused by the creation of longitudinal magnetization components.

In order to ensure that the examination or, respectively, imaging that is to be implemented can take place as desired after the modification of the control sequence has taken place, in an embodiment of the invention the minimum value of a candidate flip angle can be communicated to the user, such as via a user interface. Since this value is intuitively comprehensible for assessment of the usability of a control sequence, this presentation is preferred relative to the presentation of the minimum bandwidth of the refocusing pulses or the minimum candidate amplitude. However, this does not preclude communicating the minimum bandwidth of the refocusing pulse via the user interface instead of—or also in combination with—the value of the minimum refocusing flip angle. The use of the modified control sequence can be confirmed by a user input via the user interface.

DESCRIPTION OF THE PREFERRED EMBODIMENTS

FIG. 1 shows the workflow of an exemplary embodiment of the method according to the invention in multiple steps 1.I, 1.II, 1.III. The input or output data that are used in the individual method steps are thereby schematically illustrated in part as sections of sequence diagrams of control sequences to acquire magnetic resonance image data of an examination subject. The curve of radio-frequency field values B1 and gradient field values Gz is shown over time t.

In an initial step 1.I, a control sequence AS (with a radio-frequency pulse train RFP to control an RF transmission system of a magnetic resonance imaging system and a gradient pulse train GP to control a gradient system) is initially accepted. As mentioned, the gradient pulse train GP includes slice selection gradient pulses SLP1, SLP2 with respective associated spoiler pulses SP1, SP2', SP2, SP2' or crushers that are noise-optimized according to the method described in the preceding. The slice selection gradient pulses SLP1, SLP2 have a specific duration T1, T2 over which—in this case—a constant gradient field value Gz is generated by means of gradient coils of a magnetic resonance imaging system. A chronologically matching refocusing pulse RF1, RF2 is associated with each of the slice selection gradient pulses SLP1, SLP2, the respective maximum amplitude value A1, A2 of which refocusing pulse RF1, RF2 is selected to generate a field value B1 so that a refocusing flip angle of at least 180° can be achieved. As an example, it is assumed that this refocusing flip angle is achieved in all refocusing pulses of the control sequence with an associated selection gradient pulse.

In method step 1.I, the refocusing flip angle for each of the refocusing pulses RF1, RF2 is determined using the respective duration T1, T2 of the slice selection gradient pulses SLP1, SLP2 and the associated maximum amplitude values A1, A2 of the refocusing pulses RF1, RF2. The determination of the bandwidth of the refocusing pulses RF1, RF2 can also be viewed as equivalent. Instead of the refocusing flip angle, the term "bandwidth" could therefore respectively also be used analogously in the following description.

The determined refocusing flip angles are accepted as what are known as candidate flip angles FWC for which the execution capability of the control sequence is checked under consideration of execution capability criteria RB in the method step 1.I.

In the exemplary embodiment, the compliance with multiple execution capability criteria RB is thereby checked, which execution capability criteria are provided by the conditions that a power limit value for a maximum available power of an amplifier of the RF transmission system is complied with, and that a SAR limit value for the maximum allowed SAR exposure of an examination subject is not exceeded.

To establish the execution capability, in method step 1.I a simulation of the SAR exposure of an examination subject that is subsequently to be imaged is implemented, and a SAR exposure value is determined. Appropriate simulation methods are known to those skilled in the art. The SAR exposure value is compared with the SAR limit value provided using the execution capability criteria RB. If the SAR exposure value is less than or equal to the SAAR limit value, a first execution capability criterion RB is satisfied.

To establish the execution capability, in the method step 1.I a maximum required RF amplifier power for execution of the respective refocusing pulse RF1, RF2 is also determined for each refocusing pulse RF1, RF2. The maximum required RF amplifier power is compared with the power limit value provided using the execution capability criteria RB. If the maximum required RF amplifier power is less than or equal to the power limit value, an additional execution capability criterion RB is satisfied.

If all execution capability criteria are complied with or satisfied, the control sequence AS is classified as executable for use by a specific planned magnetic resonance imaging with a specific magnetic resonance imaging system, and for a specific examination subject. The execution capability of the control sequence is accordingly established.

In particular using the determined candidate flip angle FWC, the minimum candidate flip angle FWC of all refocusing pulses RF1, RF2 is also additionally maintained as a result of the establishment of the execution capability. The execution capability is thus determined and established as a result for a determined minimum refocusing angle FWC.

If one of the execution capability criteria RB is not satisfied, the method is continued iteratively with step 1.II.

The compliance with the execution capability criteria RB can be achieved, for example, by modification of the maximum amplitude values A1, A2 of one or more of the refocusing pulses RF1, RF2. In the described exemplary embodiment, a maximum amplitude B1Max is determined that is shown as a line in the control sequence, which enables the compliance with the conditions predetermined as execution capability criteria RB.

The determination of the maximum amplitude B1Max can take place individually for each refocusing pulse RF1, RF2, or also globally. The present invention provides an algorithm to determine the maximum amplitude B1Max, which algorithm determines how high the refocusing flip angle may be at maximum, wherein the refocusing flip angles are determined under consideration of a SAR exposure and an RF transmission power (i.e. the RFPA transmission power). To modify the control sequence AS, a predetermined step width is provided for a global (i.e. uniform) variation of all amplitudes A1, A2 of the control sequence AS, for example by a few mV or V in each iteration step.

Since the duration of the refocusing pulses is most often different, the variation of the candidate flip angle FWC then takes place individually, corresponding to the variation of the respective refocusing pulse amplitude that is predetermined by the step width. In this exemplary embodiment, the duration T1, T2 of the refocusing pulses RF1, RF2 is not varied. The duration of the slice selection gradient pulses SLP1, SLP2 has just as little modification. In spite of variation, the refocusing pulses RF1, RF2 are thus chronologically unchanged, matching the respective slice selection gradient pulses SLP1, SLP2 that are included in the control sequence AS.

Alternatively, it is also conceivable that a predetermined global step width—i.e. a step width of 5° per iteration, for example—for the modification of the candidate flip angles FWC is used to modify the control sequence AS. The respective candidate flip angles FWC that are determined for each of the refocusing pulses RF1, RF2 in Step 1.I are then respectively decreased by the predetermined step width, i.e. 5° in this case. In this alternatively procedure, the amplitude A1, A2 for each of the refocusing pulses RF1, RF2 is thus individually decreased.

The refocusing pulses RF1, RF2 with decreased amplitude (i.e. smaller maximum value of the amplitude) are inserted in a time-accurate manner into the otherwise unmodified control sequence AS instead of the refocusing pulses RF1, RF2.

The execution capability of the control sequence AS is checked again as described with regard to step 1.I. The modified control sequence AS is henceforth used for the checking or, respectively, establishment of the execution capability in step 1.I. The described method thus operates iteratively, i.e. under consideration of input data that are determined in a preceding iteration step to be repeated.

The control sequence AS adopted from step 1.II includes a modified radio-frequency pulse train RFPM. The likewise adopted gradient pulse train GPM is identical to the gradient pulse train GP of the original (i.e. unmodified) control sequence AS.

A new determination of the candidate flip angles FWC can be omitted in step 1.I since the candidate flip angles FWC that are modified in step 1.II can be adopted into step 1.I. This enables a time-efficient implementation of the method. The number N of implementations of the method step 1.II—i.e. how many iteration steps or iteration loops have taken place—is additionally counted as well, and this number N is protocoled and carried along. This number N is used to monitor a termination criterion, namely that a maximum number of implementations of the method step 1.II should not be exceeded. For this, in step 1.I the number N is compared with the maximum number of implementations as provided according to the termination criterion, and step 1.II is skipped if the number N has reached the maximum number of implementations.

The established execution capability is also a termination criterion for the implementation of modifications of the control sequence. After establishing the execution capability, the method step 1.II can then be skipped immediately.

The minimum candidate flip angle FWC of all refocusing pulses RF1, RF2—which minimum candidate flip angle FWC is maintained after satisfying a termination criterion RB is shown as an output at a user interface in Step 1.III. The user of the control sequence AS can thus intuitively receive the information as to whether the control sequence AS satisfies the demands placed on it with regard to the refocusing flip angle.

This means that the method is continued with step 1.III as soon as one of the termination criteria is satisfied, i.e. either the maximum number of implementations is achieved or it is established that the control sequence is executable under consideration of the execution capability criteria. The control sequence AS that is assessed in step 1.I (given compliance with the execution capability) to establish the execution capability, with the last, current candidate flip angle FWC as a target flip angle, is then provided for use with the defined magnetic resonance imaging system and the defined examination subject. As explained, the minimum candidate flip angle FWC provided as a refocusing flip angle is also output to a user or, respectively, stored.

As an example, in the following the refocusing pulse RF1 is considered. As can be seen from the comparison of the original radio-frequency pulse train RFP and the modified radio-frequency pulse train RFPM, the value of the amplitude A3 with which the execution capability criteria are satisfied is lower than the value of the amplitude A1. To determine the maximum amplitude value B1Max, the iteration has been started with a starting refocusing flip angle of 180° that was determined from the control sequence as a candidate flip angle FWC in step 1.I. In the shown exemplary embodiment, the amplitude value B1Max that is determined under iterative decreasing to satisfy the execution capability criteria RB corresponds to a refocusing flip angle of 160°. This value is stored as a minimum candidate flip angle FWC and is displayed to a user of the control sequence or of the determination method for a control sequence.

The user can then accept or reject the possible minimum radio-frequency coil arrangement flip angles. In the specific case, the user decides that this minimum refocusing flip angle is not sufficient in order to fulfill a specific imaging task. In this case, the method can be continued as is schematically shown in FIG. 2.

Figure 2:
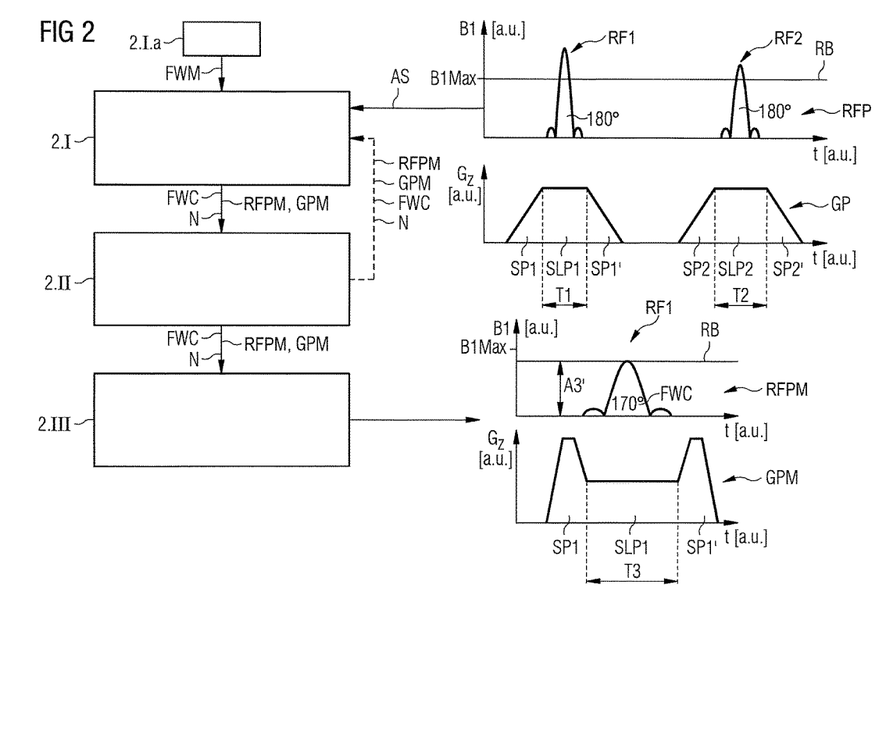
FIGS. 2 and 3 show a second exemplary embodiment of the method according to the invention.

In the following, however, the method diagrammed in FIG. 2 is described as an independent exemplary embodiment of the invention.

In order to ensure that a specific imaging task can also really be fulfilled, in an initial step 2.Ia of this method a desired minimum refocusing flip angle or, respectively, minimum refocusing flip angle FWM is predetermined. For this, a user interface—for example a keyboard, a touchscreen or a speech input system—can be provided to a user of the method. In the exemplary embodiment, the user predetermines a 170° minimum refocusing flip angle, which thus is greater than the final determined minimum candidate flip angle FWC according to FIG. 1 that has a value of 160°.

The establishment of the execution capability takes place in Step 2.I of the method, as explained with regard to Step 1.I in FIG. 1. Additionally, as an execution capability criterion RB it is monitored that each of the candidate flip angles FWC is greater than or equal to the predetermined minimum refocusing flip angle FWM, which is 170° in the exemplary embodiment.

For the case that all execution capability criteria RB are satisfied, similar to the termination criterion described with regard to step 1.I the step 2.II is skipped, and the method continues with step 2.III. As is explained with regard to step 1.III from FIG. 1, in step 2.III the minimum of the value of the candidate flip angles FWC of all refocusing pulses RF1, RF2 is additionally maintained as a result of the establishment of the execution capability, in particular is maintained using the determined candidate flip angles FWC.

If all execution capability criteria RB are not satisfied, the method is continued with step 2.II. In contrast to the method according to FIG. 1, the iteration is thereby not begun with a starting flip angle that is determined from the control sequence as a candidate flip angle FWC, but rather is started with a predetermined minimum refocusing flip angle FWM as a starting flip angle.

This starting flip angle is then used as a candidate flip angle FWC in the first iteration of the method step 2.II. For this, a maximum amplitude value is predetermined for the respective refocusing pulse or, respectively, refocusing pulses RF1, RF2. In this exemplary embodiment, the predetermined maximum amplitude value B1Max corresponds to the maximum amplitude values B1Max determined in the method according to FIG. 1 by specifying a step width for amplitudes.

However, it is also conceivable that other amplitude values are predetermined as alternatively established maximum amplitude values B1Max. For example, if only the compliance with the power limits of the RF amplifier is monitored as an execution capability criterion RB, the maximum amplitude values B1Max could also be predetermined only by a maximum executable amplitude of the power amplifier.

A minimum duration of the respective refocusing pulse RF1, RF2 is then calculated on the basis of the predetermined maximum amplitude values B1Max for the respective refocusing pulse RF1, RF2, which minimum duration is required in order to ensure the compliance with the minimum refocusing flip angle FWM using the predetermined amplitude value. This means that the minimum bandwidth of the respective refocusing pulses RF1, RF2 is calculated in order to be able to derive the minimum duration from this.

As can be seen in FIG. 1, only a candidate flip angle FWC or minimum refocusing flip angle of 160° can be maintained with the predetermined maximum amplitude B1Max and an unmodified duration T1 of the refocusing pulse RF1. This means that the minimum duration that is determined for the refocusing pulse RF1 in order to comply with a minimum refocusing flip angle of 170° is beyond the duration T1 of the slice selection gradient pulse SLP1.

In this case, the duration T1 of the slice selection gradient pulse SLP1 is increased to the duration T3 while maintaining the gradient moment generated by the slice selection gradient SLP1. In particular, it is accepted that the noise optimization of the slice selection gradient pulse SLP1 with associated spoilers SP1 is canceled in part in order to achieve the minimum refocusing flip angle FWM of 170°, and to design the control sequence to conform to the execution capability criteria RB.

Figure 3:
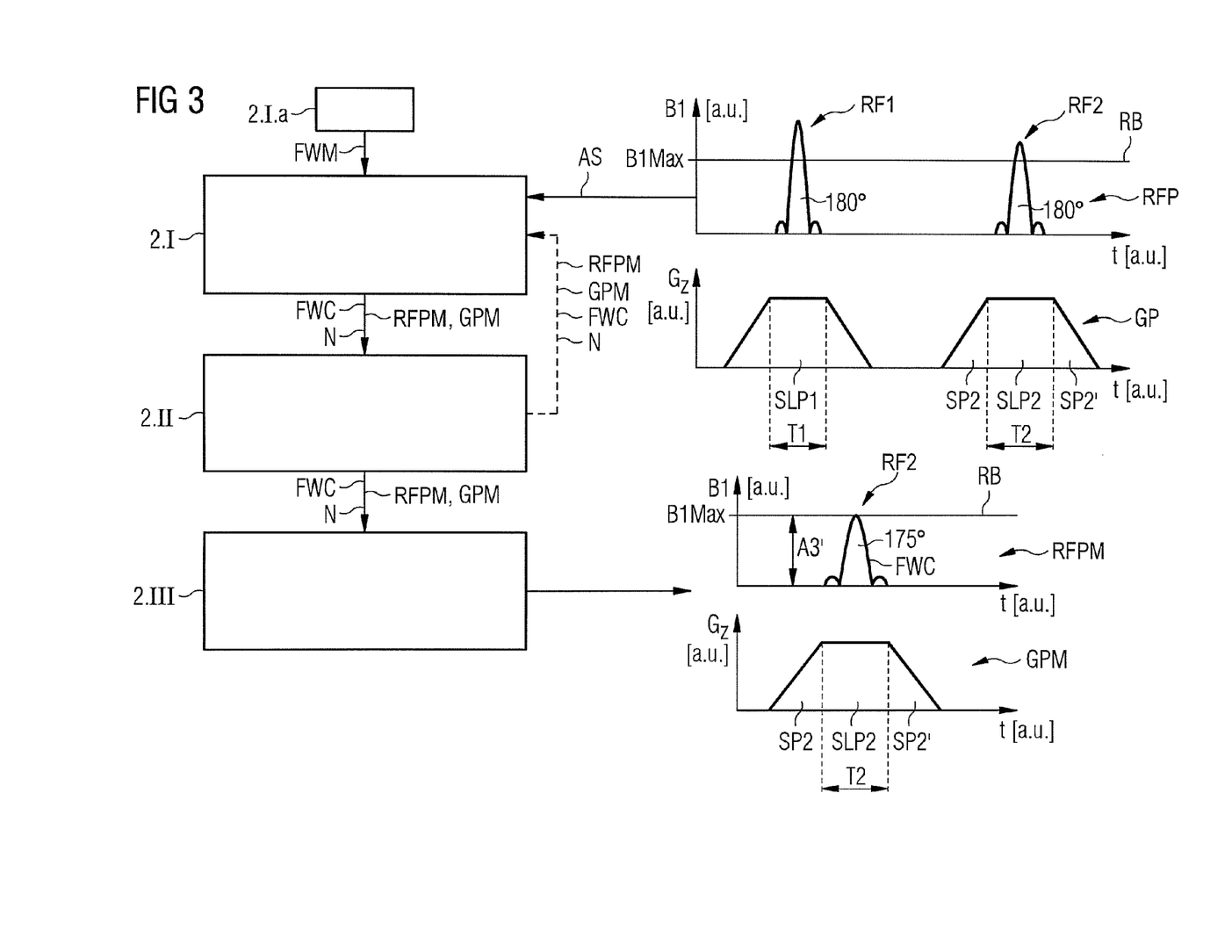

FIG. 3 shows the continuation of the method according to FIG. 2 for the case of the refocusing pulse RF2, in which the minimum duration in step 2.II is smaller than or equal to the duration of the slice selection gradient pulse SLP2 for the predetermined maximum amplitude value B1Max. In this case, given unmodified duration T2 of the refocusing pulse RF2 and of the slice selection gradient pulse SLP2, the amplitude A3' of the slice selection gradient pulse SLP2 is set to the predetermined maximum amplitude value B1Max. The candidate flip angle FWC that is generated is checked for execution capability, such as whether it is greater than the desired minimum refocusing flip angle FWM.

After this adaptation conducted in such a manner, the execution capability is again checked according to step 2.I. In the method according to FIGS. 2 and 3, the number N of executions of the method step 2.II is also monitored according to additional termination criterion. The procedure is as described with regard to FIG. 1.

Figure 4:
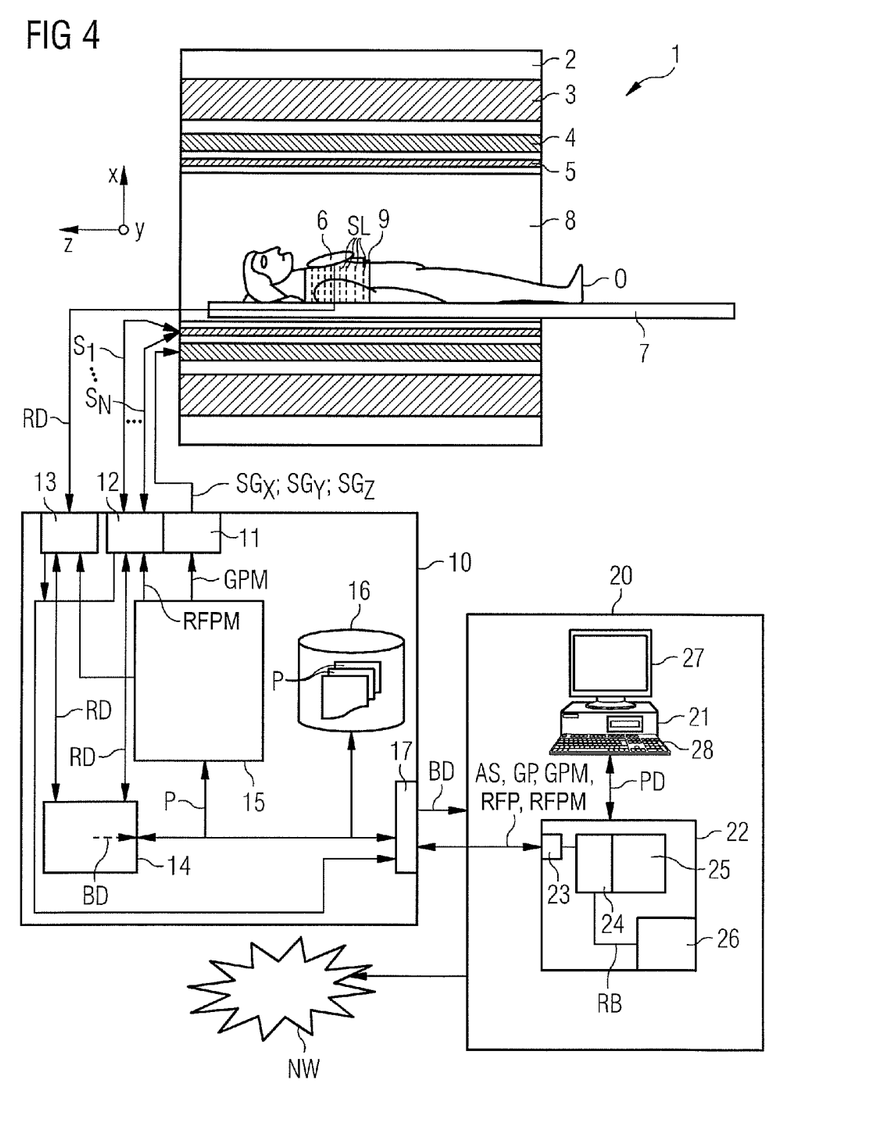
FIG. 4 illustrates a magnetic resonance imaging system according to the invention, with a control sequence determination system according to the invention.

FIG. 4 schematically shows a magnetic resonance system or, respectively, a magnetic resonance imaging system 1 according to the invention. The system includes the actual magnetic resonance scanner 2 with a measurement space 8 or patient tunnel located therein. A bed 7 can be driven into this patient tunnel 8 so that, during an examination, an examination subject O (patient/test subject) lying thereupon can be supported at a specified position within the magnetic resonance scanner 2 relative to the magnet system and radio-frequency system arranged in the magnetic resonance scanner 2 or can also be moved between different positions during a measurement.

Significant components of the magnetic resonance scanner 2 are: a basic field magnet 3; a gradient system 4 with gradient coils in order to apply arbitrary magnetic field gradients in the x-, y- and z-direction; and a whole-body radio-frequency coil 5. The reception of magnetic resonance signals induced in the examination subject O can take place via the whole-body coil 5 with which the radio-frequency signals for inducing the magnetic resonance signals are normally also emitted. However, these signals are typically received with local coils 6 placed on or below the examination subject O, for example. All of these components are known in principle to those skilled in the art, and therefore are shown only roughly schematically in FIG. 4.

The whole-body radio-frequency coil 5 can have a number N of individual antenna rods (for example in the form of what is known as a birdcage antenna) that are separately controllable as individual transmission channels S1, . . . , SN by a control device 10, meaning that the magnetic resonance tomography system 1 is a pTX-capable system. However, it is expressly noted that the method according to the invention is also applicable to classical magnetic resonance tomography apparatuses with only one transmission channel.

The control device 10 can be a control computer that can be by a number of individual computers (which may be spatially separated and connected among one another via suitable bus systems or cables or the like). This control device 10 is connected via a terminal interface 17 with a terminal 20 via which an operator can control the entire system 1. In the present case, this terminal 20 has a computer 21 with keyboard 28, one or more screens 27 as well as additional input devices (for example a mouse or the like) so that a graphical user interface is provided to the operator.

Among other things, the control device 10 has a gradient control unit 11 that can be composed of multiple partial components. The individual gradient coils are provided with control signals SGx, SGy, SGz via the gradient control unit 11. These control signals represent gradient pulses that, during a measurement, are set at precisely provided time positions and with a precisely predetermined time curve in order to scan the examination subject O and associated k-space, advantageously in individual slices SL according to a control sequence AS.

Moreover, the control device 10 has a radio-frequency (RF) transmission/reception unit 12. This RF transmission/reception unit 12 likewise has multiple sub-components in order to respectively feed radio-frequency pulses separately and in parallel to the individual transmission channels S1, ..., SN, i.e. in this case to the individually controllable antenna rods of the body coil 5. Magnetic resonance signals can also be received via the transmission/reception unit 12. In this exemplary embodiment, however, this occurs with the aid of the local coils 6. The raw data RD received with these local coils 6 are read out and processed by an RF reception unit 13. The magnetic resonance signals received by this, or by the whole body coil 5 by means of the RF transmission/reception unit 12, are passed as raw data RD to a reconstruction unit 14, which reconstructs the image data BD from these and stores these in a memory 16 and/or passes them to the terminal 20 via the interface 17 so that the operator can view them. The image data BD can also be stored and/or displayed and evaluated at other points via a network NW. Insofar as the local coils 6 have a suitable switching unit, these can also be connected to an RF transmission/reception unit 12 in order to also use the local coils to transmit, in particular in pTX operation.

The gradient coil controller 11, the RF transmission/reception unit 12 and the reception unit 13 for the local coils 6 are respectively controlled as coordinated by a measurement control unit 15. Via corresponding commands, this ensures that a desired gradient pulse train GPM is emitted via suitable gradient coil signals SGx, SGy, SGz and controls the RF transmission/reception unit 12 in parallel so that a radio-frequency pulse train RFPM is emitted, wherein the matching radio-frequency pulses are passed to the individual transmission rods of the whole-body coil 5 in parallel on the individual transmission channels S1, ..., SN. Moreover, it must be ensured that the magnetic resonance signals are read out at the local coils 6 via the RF reception unit 13 or that possible signals are read out at the whole-body coil 5 via the RF transmission/reception unit 12 at the matching point in time and are processed further. The measurement control unit 15 provides the corresponding signals RFPM to the radio-frequency transmission/reception unit 12 and the gradient pulse train GP to the gradient control unit 11 according to a predetermined control protocol P. In this control protocol P, all control data are stored that must be set during a measurement according to a predetermined control sequence AS.

A plurality of control protocols P for different measurements are typically stored in a memory 16. These could be selected by the operator via the terminal 20 and possibly be varied in order to then provide for the currently desired measurement a matching control protocol P with which the measurement control unit 15 can operate. Moreover, the operator can also retrieve control protocols P (for example from a manufacturer of the magnetic resonance system) via a network NW and can then modify and use these as necessary.

The basic workflow of such a magnetic resonance measurement and the cited components for control are known to those skilled in the art, and thus need not be explained in further detail herein. Moreover, such a magnetic resonance scanner 2 as well as the associated control device can still have a plurality of additional components that here are likewise not explained in detail. It is noted that the magnetic resonance scanner 2 can be of a different design, for example with a laterally open patient space, and that in principle the radio-frequency whole-body coil does not need to be designed as a birdcage antenna.

Moreover, here in FIG. 4 a control sequence determination system 22 according to the invention, comprised in the magnetic resonance imaging system 1, is schematically shown which serves to determine a magnetic resonance system control sequence AS. This magnetic resonance system control sequence AS includes—among other things—a pulse sequence with a gradient pulse train GP, GPM for a defined measurement in order to traverse a defined trajectory in k-space, as well as a radio-frequency pulse train RFP, RFPM coordinated with these to control the birdcage antenna. In the present case, the magnetic resonance system control sequence AS is created on the basis of parameters PD predetermined in the measurement protocol P, in particular according to a method described with regard to FIGS. 1 through 3.

As is apparent, the control sequence determination system 22 has an input interface 23 to accept a control sequence AS that is predetermined for a defined imaging task. The control sequence AS should be modified for use with the magnetic resonance imaging system 1, according to a method according to the invention under consideration of an execution capability criterion RB. The boundary conditions or execution capability criteria RB are thereby provided by a criterion source 26. For example, the criterion source 26 can be a source or, respectively, storage space for values (in particular limit values) or also rules. These can be permanently integrated into the control sequence determination system 22. It is also conceivable that the criterion source 26 is designed as an interface to accept criteria RB, for example from the noted network NW. The control sequence determination system 22 also has an evaluation unit 24 which in particular adopts the control sequence AS from the input interface 23 and/or a modification unit 25.

The evaluation unit in particular also adopts an execution capability criterion RB from the criterion interface 26 in order to implement the establishment or, respectively, checking of the execution capability of the control sequence AS as described with regard to FIGS. 1 through 3.

The modification unit 25 is designed to implement a modification of the RF pulse train and/or of the gradient pulse train GP as described with regard to FIGS. 1 through 3.

The control sequence system 22 can thereby be part of the terminal 20 of the magnetic resonance 1, as shown; however, it can alternatively be a component of the control device 10. It is also conceivable that the control sequence determination device 22 is present externally as an independent module, and is designed for use with multiple different magnetic resonance systems, in particular of different types.

Independent of this, the magnetic resonance system 1 can be operated by a control device 10 using a control sequence AS created according to the invention.

From the previous descriptions it is clear that the invention provides effective possibilities in order to adapt a predetermined control sequence to a defined magnetic resonance imaging system and/or a defined examination subject.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine a control sequence for a magnetic resonance imaging apparatus comprising an RF transmission system and a gradient system, said method comprising:
   providing a computerized processor with a control sequence comprising a radio-frequency pulse train to control the RF transmission system and a gradient pulse train, chronologically matching said radio-frequency pulse train, to control said gradient system, said gradient pulse train including a predetermined selection gradient pulse chronologically matched to a refocusing pulse in said radio-frequency pulse train, said refocusing pulse having a refocusing flip angle;
   in said computerized processor, establishing an execution capability of said control sequence by applying an execution capability criterion to said control sequence, said execution capability criterion embodying a criterion for a minimum refocusing flip angle of said refocusing flip angle of said refocusing pulse;
   in said computerized processor, if said control sequence does not already satisfy said execution capability criterion, modifying at least one of said refocusing pulse or said selection gradient pulse to produce a modified control sequence that is closer to satisfying said execution capability criterion than said control sequence; and
   making said modified control sequence available at an output of the computerized processor in an electronic format for controlling said magnetic resonance imaging apparatus.

2. A method as claimed in claim 1 comprising, in said computerized processor, employing, as said execution capability criterion, an execution capability criterion that is based on at least one of an SAR exposure value or a hardware parameter of said magnetic resonance apparatus, in addition to said minimum refocusing flip angle.

3. A method as claimed in claim 1 comprising producing said modified control sequence by modifying an amplitude of said refocusing pulse.

4. A method as claimed in claim 1 comprising, in said computerized processor, repeatedly modifying said control sequence in a plurality of successive iterations, until satisfying a termination criterion.

5. A method as claimed in claim 4 comprising, in each of said successive iterations, modifying said at least one of said refocusing pulse or said selection gradient pulse by a predetermined step width.

6. A method as claimed in claim 1 comprising, in said computerized processor, setting said minimum refocusing flip angle in said execution capability criterion dependent on a duration of said selection gradient pulse.

7. A method as claimed in claim 6 comprising determining a candidate minimum value of the refocusing flip angle in said computerized processor and, at a user interface in communication with said computerized processor, displaying said candidate minimum value of said refocusing flip angle, and allowing entry into said computerized processor, via said user interface, of a user input that designates the displayed candidate minimum value as the minimum refocusing flip angle in said execution capability criterion.

8. A method as claimed in claim 7 wherein said user input is an acceptance of the candidate minimum refocusing angle displayed at said user interface.

9. A method as claimed in claim 1 wherein said selection gradient pulse in said control sequence has a gradient moment, and wherein said selection gradient pulse is also modified in order to produce said modified control sequence, and comprising, in said computerized processor, modifying a duration of said selection gradient pulse while maintaining said gradient moment.

10. A control sequence determination device to determine a control sequence for a magnetic resonance imaging apparatus comprising an RF transmission system and a gradient system, said control sequence determination device comprising:
   an input interface that receives a control sequence comprising a radio-frequency pulse train to control the RF transmission system and a gradient pulse train, chronologically matching said radio-frequency pulse train, to control said gradient system, said gradient pulse train including a predetermined selection gradient pulse chronologically matched to a refocusing pulse in said radio-frequency pulse train, said refocusing pulse having a refocusing flip angle;
   a processor in communication with said input interface, said processor being configured to establish an execution capability of said control sequence by applying an execution capability criterion to said control sequence, said execution capability criterion embodying a criterion for a minimum refocusing flip angle of said refocusing flip angle of said refocusing pulse;
   said processor being configured, if said control sequence does not already satisfy said execution capability criterion, to modify at least one of said refocusing pulse or said selection gradient pulse to produce a modified control sequence that is closer to satisfying said execution capability criterion than said control sequence;
   an output interface in communication with said processor; and
   said processor being configured to make said modified control sequence available at an output of the computerized processor in an electronic format for controlling said magnetic resonance imaging apparatus.

11. A magnetic resonance apparatus comprising:
   a magnetic resonance data acquisition unit comprising a radio-frequency system and a gradient system;
   a computerized processor provided with a control sequence comprising a radio-frequency pulse train to control the RF transmission system and a gradient pulse train, chronologically matching said radio-frequency pulse train, to control said gradient system, said gradient pulse train including a predetermined selection gradient pulse chronologically matched to a refocusing pulse in said radio-frequency pulse train, said refocusing pulse having a refocusing flip angle;
   said computerized processor being configured to establish an execution capability of said control sequence by applying an execution capability criterion to said control sequence, said execution capability criterion embodying a criterion for a minimum refocusing flip angle of said refocusing flip angle of said refocusing pulse;
   said computerized processor being configured, if said control sequence does not already satisfy said execution capability criterion, to modify at least one of said refocusing pulse or said selection gradient pulse to produce a modified control sequence that is closer to satisfying said execution capability criterion than said control sequence; and said computerized processor being configured to make said modified control sequence available at an output of the computerized processor in an electronic format for controlling said magnetic resonance data acquisition unit.

12. A non-transitory, computer-readable data storage medium encoded with programming instructions, said storage medium being loaded into a computerized processor of a magnetic resonance apparatus, that also comprises a radio-frequency system and a gradient system, said programming instructions causing said computerized processor to:

receive a control sequence comprising a radio-frequency pulse train to control the RF transmission system and a gradient pulse train, chronologically matching said radio-frequency pulse train, to control said gradient system, said gradient pulse train including a predetermined selection gradient pulse chronologically matched to a refocusing pulse in said radio-frequency pulse train, said refocusing pulse having a refocusing flip angle;

establish an execution capability of said control sequence by applying an execution capability criterion to said control sequence, said execution capability criterion embodying a criterion for a minimum refocusing flip angle of said refocusing flip angle of said refocusing pulse;

if said control sequence does not already satisfy said execution capability criterion, modify at least one of said refocusing pulse or said selection gradient pulse to produce a modified control sequence that is closer to satisfying said execution capability criterion than said control sequence; and make said modified control sequence available at an output of the computerized processor in an electronic format for controlling said magnetic resonance imaging apparatus.

\* \* \* \* \*